United States Patent
Nakamura et al.

(10) Patent No.: US 8,975,623 B2
(45) Date of Patent: Mar. 10, 2015

(54) ORGANIC ELECTROLUMINESCENCE ELEMENT

(75) Inventors: Masahiro Nakamura, Eindhoven (NL); Masahito Yamana, Hyogo (JP); Mitsuo Yaguchi, Osaka (JP); Takeyuki Yamaki, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/110,968

(22) PCT Filed: Apr. 23, 2012

(86) PCT No.: PCT/JP2012/060888
§ 371 (c)(1),
(2), (4) Date: Oct. 10, 2013

(87) PCT Pub. No.: WO2012/160926
PCT Pub. Date: Nov. 29, 2012

(65) Prior Publication Data
US 2014/0027756 A1  Jan. 30, 2014

(30) Foreign Application Priority Data
May 20, 2011  (JP) .................. 2011-113514

(51) Int. Cl.
*H01L 29/08* (2006.01)
*H01L 51/52* (2006.01)

(52) U.S. Cl.
CPC ........ *H01L 51/5203* (2013.01); *H01L 51/5228* (2013.01)
USPC ............................. 257/40; 257/99

(58) Field of Classification Search
CPC .................................................. H01L 51/5203
USPC ....................................... 257/40, 99
See application file for complete search history.

(56) References Cited

U.S. PATENT DOCUMENTS

| 6,087,772 A | 7/2000 | Ootsuki et al. |
| 6,302,756 B1 | 10/2001 | Ootsuki et al. |

(Continued)

FOREIGN PATENT DOCUMENTS

| JP | 10-134964 A | 5/1998 |
| JP | 2001-210469 A | 8/2001 |

(Continued)

OTHER PUBLICATIONS

International Search Report for corresponding International Application No. PCT/JP2012/060888 mailed Jun. 5, 2012.

(Continued)

*Primary Examiner* — Mark Prenty
(74) *Attorney, Agent, or Firm* — Renner, Otto, Boisselle & Sklar, LLP

(57) ABSTRACT

The organic electroluminescence element in accordance with the present invention includes: a light-emitting layer; a first electrode layer on a first surface in a thickness direction of the light-emitting layer; a second electrode layer on a second surface in the thickness direction of the light-emitting layer; an electrically conductive layer; and an insulating layer. The light-emitting layer is configured to emit light when a predetermined voltage is applied between the first and second electrode layers. The second electrode layer includes an electrode part covering the second surface and an opening part formed in the electrode part to expose the second surface. The electrically conductive layer is designed to allow the light to pass therethrough, and is interposed between the second surface and the second electrode layer to cover the second surface. The insulating layer is interposed between the second surface and the electrically conductive layer to overlap the electrode part.

7 Claims, 4 Drawing Sheets

(56) References Cited

U.S. PATENT DOCUMENTS

2009/0233086 A1    9/2009  Hirai
2014/0021463 A1*   1/2014  Nakamura et al. .............. 257/40

FOREIGN PATENT DOCUMENTS

| | | |
|---|---|---|
| JP | 2002-502540 A | 1/2002 |
| JP | 2002-352963 A | 12/2002 |
| JP | 2003-017249 A | 1/2003 |
| JP | 2005-302397 A | 10/2005 |
| JP | 2006-505111 A | 2/2006 |
| JP | 2006-331694 A | 12/2006 |
| JP | 2007-213999 A | 8/2007 |
| JP | 2008-243567 A | 10/2008 |
| JP | 2009-224183 A | 10/2009 |
| JP | 2010-272271 A | 12/2010 |
| WO | WO 98/07136 A2 | 2/1998 |
| WO | WO 2004/042838 A1 | 5/2004 |

OTHER PUBLICATIONS

Form PCT/ISA/237 for corresponding International Application No. PCT/JP2012/060888 dated Jun. 5, 2012.

* cited by examiner

ORGANIC ELECTROLUMINESCENCE ELEMENT

TECHNICAL FIELD

The present invention relates to organic electroluminescence elements.

BACKGROUND ART

In the past, there has been proposed an organic electroluminescence element having a structure shown in FIG. 7 (document 1 [JP 2006-331694 A]).

In this organic electroluminescence element, one electrode (cathode) 101 is placed on a surface of a substrate 104, and a light-emitting layer 103 is placed on a surface of the electrode 101 while an electron injection/transport layer 105 is interposed therebetween, and the other electrode (anode) 102 is placed on the light-emitting layer 103 while a hole injection/transport layer 106 is interposed therebetween.

Further, this organic electroluminescence element includes an encapsulating member 107 that is on the surface of the substrate 104. Therefore, in this organic electroluminescence element, light produced in the light-emitting layer 103 is emitted outside through the electrode 102 formed as a light transmissive electrode and the encapsulating member 107 made of a transparent material.

The electrode 101 with light reflectivity is made of e.g., Al, Zr, Ti, Y, Sc, Ag, or In, for example. The electrode 102 serving as a light transmissive electrode is made of indium tin oxide (ITO) or indium zinc oxide (IZO), for example.

To enable the organic electroluminescence element to emit light with high luminance, it is necessary to supply a large current. However, in a general organic electroluminescence element, the anode formed of an ITO film has a larger sheet resistance than that of the cathode formed of a metal film, an alloy film, a metal compound film or the like. Therefore, the anode tends to have a larger potential gradient and therefore in-plane unevenness in luminance is likely to increase.

Further, in the past, there has been proposed an organic electroluminescence lamp capable of solving the problem which would otherwise occur when a structure including an electrode formed of an ITO film prepared with sputtering is employed. Such an organic electroluminescence lamp is designed without using an electrode formed of an ITO film (see document 2 [JP 2002-502540 A]).

Document 2 discloses an electroluminescence lamp 210 as shown in FIG. 8. The electroluminescence lamp 210 includes a first electrically conductive layer 220, an electroluminescence material 230, a second electrically conductive layer 240 and a substrate 245. The first electrically conductive layer 220 is formed as a rectangular grid electrode provided with rectangular-shaped openings 250.

In this regard, document 2 describes that the first electrically conductive layer 220 and the second electrically conductive layer 240 are preferably made of conductive ink such as silver ink and carbon ink.

Furthermore, document 2 described that the first electrically conductive layer 220, the electroluminescence material 230 and the second electrically conductive layer 240 are formed with screen printing, offset printing or the like.

Note that, document 2 says that if a uniform brightness electroluminescence lamp 210 is required the density of the openings 250 must therefore be approximately constant over the lamp's surface.

In the electroluminescence lamp 210 designed as shown in FIG. 8, the first electrically conductive layer 220 includes the openings 250. Therefore, carriers are injected from the first electrically conductive layer 220 into only a region of the electroluminescence material 230 directly beneath the first electrically conductive layer 220.

Accordingly, in the electroluminescence lamp 210, it is concerned that the electroluminescent material 230 has a low luminous efficiency at regions corresponding to the openings 250 and that consequently the external quantum efficiency becomes low.

SUMMARY OF INVENTION

In view of the above insufficiency, the present invention has aimed to propose an organic electroluminescence element capable of reducing luminance unevenness and improving an external quantum efficiency.

The organic electroluminescence element of the first aspect in accordance with the present invention includes a light-emitting layer; a first electrode layer disposed on a first surface in a thickness direction of the light-emitting layer; a second electrode layer disposed on a second surface in the thickness direction of the light-emitting layer; an electrically conductive layer; and an insulating layer. The light-emitting layer is configured to emit light when a predetermined voltage is applied between the first electrode layer and the second electrode layer. The second electrode layer includes an electrode part covering the second surface and an opening part formed in the electrode part to expose the second surface. The electrically conductive layer is configured to allow the light to pass therethrough, and is interposed between the second surface and the second electrode layer to cover the second surface. The insulating layer is interposed between the second surface and the electrically conductive layer to overlap the electrode part in the thickness direction.

With regard to the organic electroluminescence element of the second aspect in accordance with the present invention, in addition to the first aspect, the electrically conductive layer includes a first part designed to cover a region of the second surface exposed via the opening part and a second part interposed between the insulating layer and the electrode part. The first part has a thickness less than a total of thicknesses of the insulating layer, the second part, and the electrode part.

With regard to the organic electroluminescence element of the third aspect in accordance with the present invention, in addition to the first or second aspect, the organic electroluminescence element further includes a hole injection layer. The first electrode layer serves as a cathode. The second electrode layer serves as an anode. The hole injection layer is interposed between the light-emitting layer and the electrically conductive layer. The insulating layer is present between the hole injection layer and the electrically conductive layer.

With regard to the organic electroluminescence element of the fourth aspect in accordance with the present invention, in addition to the first or second aspect, the organic electroluminescence element further includes an electron blocking layer. The first electrode layer serves as a cathode. The second electrode layer serves as an anode. The electrically conductive layer is designed to function as a hole injection layer. The electron blocking layer is interposed between the light-emitting layer and the electrically conductive layer. The insulating layer is present between the electron blocking layer and the electrically conductive layer.

With regard to the organic electroluminescence element of the fifth aspect in accordance with the present invention, in addition to any one of the first to fourth aspects, the second electrode layer is made of a mixture of metal powder and an organic binder.

With regard to the organic electroluminescence element of the sixth aspect in accordance with the present invention, in addition to any one of the first to fifth aspects, the electrically conductive layer is: a transparent conductive film made of a transparent medium containing an electrically conductive nanostructure; or a metal thin film having a thickness to allow the light to pass therethrough.

With regard to the organic electroluminescence element of the seventh aspect in accordance with the present invention, in addition to any one of the first to sixth aspects, each material of the first electrode layer and the second electrode layer has a resistivity lower than a resistivity of a transparent conducting oxide.

DESCRIPTION OF EMBODIMENTS (First Embodiment)

Figure 1:
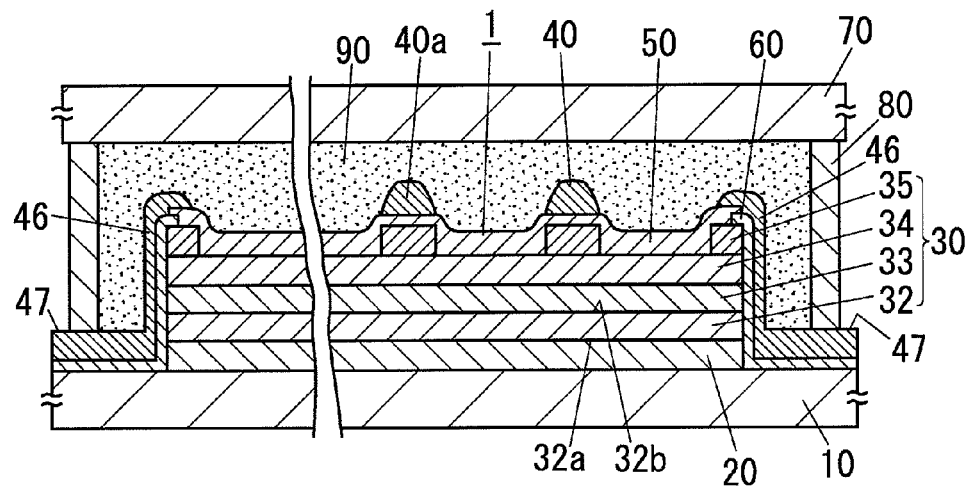
FIG. 1 is a schematic sectional view illustrating the organic electroluminescence element of the first embodiment.
Figure 2:
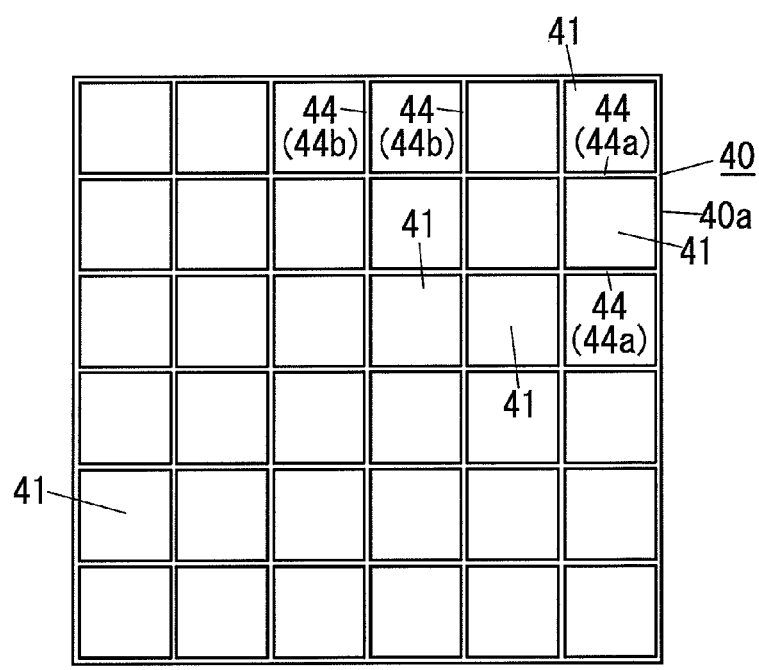
FIG. 2 is a schematic plan view illustrating the second electrode of the organic electroluminescence element of the first embodiment.
Figure 3:
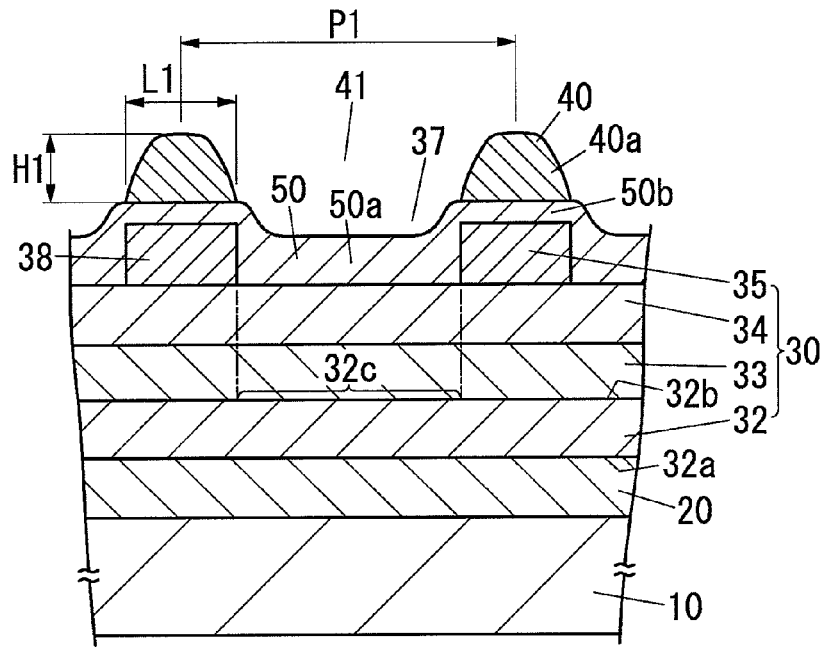
FIG. 3 is a schematic sectional view illustrating the primary part of the organic electroluminescence element of the first embodiment.

The following explanation referring to FIG. 1 to FIG. 3 is made to the organic electroluminescence element of the present embodiment.

The organic electroluminescence element includes a substrate 10, a first electrode 20 disposed on a surface (upper surface in FIG. 1) of the substrate 10, a second electrode 40 disposed over the surface of the substrate 10 so as to face the first electrode 20, and a functional layer 30 disposed between the first electrode 20 and the second electrode 40. The functional layer 30 includes a light-emitting layer 32.

In other words, the organic electroluminescence element (organic light-emitting diode) includes the light-emitting layer 32, the first electrode (first electrode layer) 20 and the second electrode (second electrode layer) 40. The first electrode 20 is disposed on a first surface 32a (lower surface in FIG. 1) of the light-emitting layer 32 in a thickness direction (upward and downward direction in FIG. 1). The second electrode 40 is disposed on a second surface 32b (upper surface in FIG. 1) of the light-emitting layer 32 in the thickness direction.

Note that, the first electrode 20 is not necessarily required to be directly formed on the first surface 32a of the light-emitting layer 32. Also, the second electrode 40 is not necessarily required to be directly formed on the second surface 32b of the light-emitting layer 32.

Further, the organic electroluminescence element includes a first terminal part (not shown) electrically connected to the first electrode 20 through a first extended wire (not shown), and a second terminal part 47 electrically connected to the second electrode 40 through a second extended wire 46. The first extended wire, the first terminal part, the second extended wire 46 and the second terminal part 47 are located over the surface of the substrate 10.

Further, the organic electroluminescence element includes an insulating film 60 that is formed on the surface of the substrate 10. The insulating film 60 electrically insulates the second extended wire 46 from the functional layer 30, the first electrode 20 and the first extended wire. The insulating film 60 is formed continuously to extend over the surface of the substrate 10, a side surface of the first electrode 20, a side surface of the functional layer 30, and a periphery of a surface (upper surface in FIG. 1) of the functional layer 30 close to the second electrode 40.

Furthermore, in the organic electroluminescence element, each of the first electrode 20 and the second electrode 40 has a resistivity (electrical resistivity) lower than a resistivity (electrical resistivity) of a transparent conducting oxide (TCO). Examples of the transparent conductive oxide include ITO, AZO, GZO, and IZO.

Moreover, in the organic electroluminescence element, the second electrode 40 includes a first opening part 41 (see FIG. 2 and FIG. 3) for allowing light from the functional layer 30 to pass. In other words, as shown in FIG. 1, the second electrode 40 includes an electrode part (a patterned electrode) 40a covering the second surface 32b of the light-emitting layer 32, and the opening part (first opening part) 41 formed in the patterned electrode 40a in such a way as to expose the second surface 32b of the light-emitting layer 32 therethrough. In the present embodiment, the second electrode 40 includes a plurality of opening parts 41.

Further, in the organic electroluminescence element, the functional layer 30 includes an insulating layer 35 that is closer to the second electrode 40 than the light-emitting layer 32 is, and is disposed directly beneath the second electrode 40. The insulating layer 35 includes a second opening part 37 (see FIG. 3) for allowing light from the functional layer 30 to pass.

Further, the organic electroluminescence element includes an electrically conductive layer 50 with a light transmissive property. The electrically conductive layer 50 is present between the second electrode 40 and the insulating layer 35 and inside the second opening part 37 so as to be in contact with the second electrode 40 and the functional layer 30.

In brief, the organic electroluminescence element further includes the insulating layer 35 and the electrically conductive layer 50.

The electrically conductive layer 50 is designed to allow light emitted from the light-emitting layer 32 to pass therethrough. The electrically conductive layer 50 is interposed between the second electrode layer 40 and the second surface 32b so as to cover the second surface 32b of the light-emitting layer 32. Thus, the electrically conductive layer 50 electrically connects the second electrode layer 40 to the light-emitting layer 32 (functional layer 30). In other words, the electrically conductive layer 50 functions as an auxiliary electrode layer for evenly applying a voltage to the second surface 32b of the light-emitting layer 32. Especially, in the present embodiment, the electrically conductive layer 50 is formed to cover the whole of the second surface 32b of the light-emitting layer 32.

The insulating layer 35 is interposed between the second surface 32b and the electrically conductive layer 50 so as to overlap the electrode part (patterned electrode) 40a in the thickness direction of the light-emitting layer 32. In more detail, the insulating layer 35 is interposed between the second surface 32b and the electrically conductive layer 50 in such a way as to overlap the electrode part 40a, but not to overlap the first opening part 41, in the thickness direction of the light-emitting layer 32. Note that, it is not always necessary that the insulating layer 35 is interposed between the second surface 32b and the electrically conductive layer 50 in such a way not to overlap the first opening part 41 in the strict sense of the word. In brief, the insulating layer 35 is allowed to partially overlap the first opening part 41, provided that the insulating layer 35 does not excessively prevent light from passing through the first opening part 41.

Accordingly, the organic electroluminescence element allows emission of light through the second electrode 40. In short, the organic electroluminescence element of the present embodiment can be used as a top emission type organic electroluminescence element.

It is preferable that the organic electroluminescence element includes a cover substrate 70 and a frame part 80. The cover substrate 70 is light transmissive. The cover substrate 70 is disposed so as to face the substrate 10. The frame part 80 is formed into a frame shape (rectangular frame shape in the present embodiment). The frame part 80 is interposed between a periphery of the substrate 10 and a periphery of the cover substrate 70.

Besides, it is preferable that the organic electroluminescence element includes an encapsulating member 90 in a space enclosed by the substrate 10, the cover substrate 70, and the frame part 80. The encapsulating member 90 is made of a light transmissive material (e.g. transparent resin). The encapsulating member 90 encapsulates an element part 1 that may include the first electrode 20, the functional layer 30, the second electrode 40 and the electrically conductive layer 50.

The following is a detailed explanation made to each component of the organic electroluminescence element.

The substrate 10 is formed into a rectangular shape in a plan view. Note that, the shape of the substrate 10 in a plan view is not limited to a rectangular shape, but may be a polygonal shape other than the rectangular shape, a circular shape or the like.

The substrate 10 is formed of a glass substrate, but is not limited thereto. For example, a plastic plate, a metal plate, or the like may be used for the substrate 10. Examples of materials of the glass substrate include soda-lime glass and non-alkali glass and the like. Examples of materials of the plastic plate include polyethylene terephthalate, polyethylene naphthalate, poly ether sulfone, polycarbonate and the like. Examples of materials of the metal plate include aluminum, copper, stainless steel and the like. As to the plastic plate, in order to suppress the transmission of water, it is preferred to use a plastic plate including a plastic substrate and a SiON film, SiN film or the like, formed on the plastic substrate. The substrate 10 may be rigid or flexible.

In a case where the substrate 10 is formed of a glass substrate, irregularity of the surface of the substrate 10 may cause a leak current of the organic electroluminescence element (i.e. may cause deterioration of the organic electroluminescence element). Therefore, in the case where the glass substrate is used for the substrate 10, it is preferred to prepare a glass substrate for device formation which is highly-polished such that the surface has a sufficiently small roughness.

With regard to a surface roughness of the surface of the substrate 10, an arithmetic average roughness Ra defined in JIS B 0601-2001 (ISO 4287-1997) is preferably 10 nm or less and is more preferably several nm or less. In contrast, when a plastic plate is used for the substrate 10, it is possible to obtain a substrate which has an arithmetical average roughness Ra of the surface that is several nm or less, at lowered cost, without performing highly precise polishing particularly.

The cover substrate 70 is formed of a glass substrate, but is not limited thereto. For example, a plastic plate or the like may be used for the cover substrate 70. Examples of material of the glass substrate include soda-lime glass, non-alkali glass and the like. Examples of material of the plastic plate include polyethylene terephthalate, polyethylene naphthalate, poly ether sulfone, polycarbonate and the like.

In the present embodiment, the cover substrate 70 has a flat plate shape, but the shape of the cover substrate 70 is not limited particularly. For example, the cover substrate 70 may be provided with a recessed portion for accommodating the element part 1 at a surface thereof facing the substrate 10, and the entire area surrounding the recessed portion within the facing surface may be bonded to the substrate 10.

This configuration has an advantage that there is no need to prepare the frame part 80 provided as a separate part from the cover substrate 70. In contrast, in a case where the cover substrate 70 formed into a flat plate shape and the frame part 80 formed into a frame shape are provided as separate parts, there is an advantage that it is possible to use materials satisfying the respective requirements of an optical property (e.g., an optical transmittance and a refractive index) necessary for the cover substrate 70 and a property (e.g., a gas barrier property) necessary for the frame part 80.

It is preferred that the organic electroluminescence element includes a light extraction structure (not shown) on an outer surface of the cover substrate 70 (the opposite side of the cover substrate 70 from the substrate 10; an upper surface of the cover substrate 70 in FIG. 1) for suppressing reflection of the light emitted from the light-emitting layer 32 at the outer surface.

For example, the above light extraction structure may be an uneven structure having a two-dimensional periodic structure. In a case where the wavelength of the light emitted from the light-emitting layer falls within a range of 300 nm to 800 nm, the periodic length of such a two-dimensional periodic structure is preferably within a range of quarter to tenfold of a wavelength $\lambda$. The wavelength $\lambda$ denotes the wavelength of the light in the medium (i.e. $\lambda$ is obtained by dividing the wavelength in vacuum by the refractive index of the medium). Such an uneven structure can be preliminarily formed on the outer surface with an imprint method such as a thermal imprint method (a thermal nanoimprint method) and a photo imprint method (a photo nanoimprint method).

Furthermore, depending on the material of the cover substrate 70, the cover substrate 70 can be formed with injection molding. In this case, the uneven structure can be formed directly on the cover substrate 70 by using a proper mold in a process of injection molding. Also, the uneven structure can be formed of a member separate from the cover substrate 70. For example, the uneven structure can be constituted by a prismatic sheet (e.g. a light diffusion film such as LIGHT-UP GM3 ("LIGHT UP" is a registered trademark) available from KIMOTO CO., LTD.).

The organic electroluminescence element of the present embodiment includes the light extraction structure and therefore it is possible to reduce the reflection loss of the light which is emitted from the light-emitting layer 32 and then strikes the outer surface of the cover substrate 70. As a result, this configuration can improve the light extraction efficiency.

The frame part 80 and the first surface of the substrate 10 are bonded to each other by means of a first bonding material. The first bonding material is epoxy resin, but is not limited thereto. For example, acrylic resin or the like can be used as the first bonding material. Epoxy resin, acrylic resin etc. used as the first bonding material may be ultraviolet-curing resin, thermosetting resin, or the like. Also, epoxy resin containing filler (made of e.g. silica, alumina) also can be used for the first bonding material. The frame part 80 is bonded in an airtight manner to the surface of the substrate 10 at the entire periphery of the surface of the frame part 80 facing the substrate 10.

The frame part 80 and the cover substrate 70 are bonded to each other by means of a second bonding material. The second bonding material is epoxy resin, but is not limited thereto. For example, acrylic resin, fritted glass or the like can be used as the second bonding material. Epoxy resin, acrylic resin etc. used as the second bonding material may be ultraviolet-curing resin, thermosetting resin, or the like. Also, epoxy resin containing filler (made of e.g. silica, alumina) also can be used for the second bonding material. The frame part 80 is bonded in an airtight manner to the cover substrate 70 at the entire periphery of the surface of the frame part 80 facing the cover substrate 70.

Examples of material of the insulating film 60 include polyimide, novolak resin, epoxy resin and the like.

The light transmissive material used as the material of the encapsulating member 90 may be light transmissive resin such as epoxy resin and silicone resin. It is preferable that the light transmissive resin has a refractive index close to the refractive index of the functional layer 30. Further, the light transmissive material may be a light transmissive resin containing light diffusion material (e.g., glass). Also, the light transmissive material may be an organic-inorganic hybrid material in which an organic compound and an inorganic compound are mixed and bonded at the nanometer or molecular level.

In the organic electroluminescence element of the present embodiment, the first electrode 20 serves as a cathode and the second electrode 40 serves as an anode.

The functional layer 30 includes the light-emitting layer 32, an interlayer 33, a carrier injection layer 34 and the insulating layer 35 which are arranged in this order from the first electrode 20.

In the organic electroluminescence element of the present embodiment, the insulating layer 35 is interposed between the second surface 32b (in the present embodiment, the surface of the carrier injection layer 34) of the light-emitting layer 32 and the electrically conductive layer 50 in such a way as to overlap the electrode part (the patterned electrode) 40a in the thickness direction of the light-emitting layer 32.

For example, as shown in FIG. 3, the insulating layer 35 includes: an insulating part (patterned insulator) 38 covering the second surface 32b of the light-emitting layer 32; and the opening part (second opening part) 37 formed in the patterned insulator 38 such that the second surface 32b of the light-emitting layer 32 is exposed therethrough. In the present embodiment, the insulating layer 35 has a plurality of opening parts 37. In the organic electroluminescence element of the present embodiment, the insulating layer 35 is formed into the substantially same shape (square) as the second electrode 40.

The insulating layer 35 is disposed on the light-emitting layer 32 such that the patterned insulator 38 and the second opening part 37 overlap the patterned electrode 40a of the second electrode 40 and the first opening part 41 in the thickness direction of the light-emitting layer 32, respectively.

In this regard, a first carrier injected from the first electrode 20 to the functional layer 30 is an electron, and a second carrier injected from the second electrode 40 to the functional layer 30 is a hole.

In this regard, it is preferable that the carrier injection layer (hereinafter, referred to as "the first carrier injection layer") is interposed between the first electrode 20 and the light-emitting layer 32. The first carrier injection layer on a side of the light-emitting layer 32 close to the first electrode 20 is an electron injection layer, and the carrier injection layer 34 (hereinafter, referred to as "the second carrier injection layer 34") on a side of the light-emitting layer 32 close to the second electrode 40 is a hole injection layer.

Note that, in a case where the first electrode 20 serves as an anode and the second electrode 40 serves as a cathode, the hole injection layer may be used as the first carrier injection layer, and the electron injection layer may be used as the second carrier injection layer 34, and the interlayer 33 may be interposed between the first carrier injection layer and the light-emitting layer 32.

The structure of the aforementioned functional layer 30 is not limited to the above example. For example, the electron transport layer may be disposed as a first carrier transport layer between a first carrier injection layer and the light-emitting layer 32, and a hole transport layer may be disposed as a second carrier transport layer between the second carrier injection layer 34 and the interlayer 33.

Further, it is sufficient that the functional layer 30 includes the light-emitting layer 32 and the insulating layer 35 (i.e., the functional layer 30 may include only the light-emitting layer 32 and the insulating layer 35). Components other than the light-emitting layer 32 and the insulating layer 35, namely, the first carrier injection layer, the first carrier transport layer, the interlayer 33, the second carrier transport layer, the second carrier injection layer 34 and the like are optional.

The light-emitting layer 32 is designed to emit light in response to a predetermined voltage applied between the first electrode layer (first electrode) 20 and the second electrode layer (second electrode) 40. The light-emitting layer 32 may be either a single-layer structure or a multilayer structure. In a case where white light is required, the light-emitting layer may be doped with three kinds of dye materials, i.e. red, green, blue dyes; may have a laminate structure including a blue light emitting layer with a hole transport property, a green light emitting layer with an electron transport property and a red light emitting layer with an electron transport property; or may have a laminate structure including a blue light emitting layer with an electron transport property, a green light emitting layer with an electron transport property and a red light emitting layer with an electron transport property.

Examples of materials of the light-emitting layer 32 include Poly(p-phenylenevinylene) derivative, polythiophene derivative, poly(p-phenylene) derivative, polysilane derivative, and polyacetylene derivative; polymerized compound of such as polyfluorene derivative, polyvinyl carbazole derivative, chromoporic material, and luminescence material of metal complexes; anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, coumalin, oxadiazol, his benzo ide quinazoline, Bisusuchiriru, cyclopentadiene, quinoline-metal complex, tris(8-hydroxyquinolinate)aluminum complex, tris(4-methyl-8-quinolinate)aluminum complex, tris(5-phenyl-8-quinolinate)aluminum complex, aminoquinoline-metal complex, benzoquinoline-metal complex, tri-(p-terphenyl-4-yl)amine, pyrane, quinacridone, rubrene and their derivatives; 1-aryl-2,5-di(2-thienyl)pyrrole derivative, distyrylbenzene derivative, distyrylarylene derivative, styrylarylene derivative, styrylamine derivative, and various compounds containing a group (radical) that is formed of the above-listed luminescent material. The material of the light-emitting layer 32 is not limited to compounds based on fluorescent dye listed above, and examples of materials of the light-emitting layer 32 include so-called phosphorescent material such as iridium complex, osmium complex, platinum complex, europium complex, and compounds or polymer molecules containing one of these complexes. One or plural of these materials can be selected and used as necessary.

The light-emitting layer 32 is preferably formed into a film shape with a wet process such as a coating method (e.g., a spin coating method, spray coating method, dye coating method, gravure printing method, and screen printing method). However, the light-emitting layer 32 may be formed into a film shape with a dry process such as a vacuum vapor deposition method and a transfer method as well as by the coating method.

Examples of material for the electron injection layer include metal fluorides (e.g., lithium fluoride and magnesium fluoride), metal halide compounds (e.g., metal chlorides typified by sodium chloride and magnesium chloride) and oxides such as titanium oxide, zinc oxide, magnesium oxide, calcium oxide, barium oxide and strontium oxide. In the case where these materials are used, the electron injection layer can be formed by a vacuum vapor deposition method.

Also, the electron injection layer can be made of an organic semiconductor material doped with dopant (such as alkali metal) for promoting electron injection. In the case where such material is used, the electron injection layer can be formed with a coating method.

Material of the electron transport layer can be selected from the group of compounds that allow electron transport. Examples of such types of compounds may include a metal complex that is known as electron transporting material (e.g., $Alq_3$), and compounds having a heterocycle (e.g., phenanthroline derivatives, pyridine derivatives, tetrazine derivatives, and oxadiazole derivatives), but are not limited thereto, and any electron transport material that is generally known can be used.

The hole transport layer can be made of low-molecular material or polymeric material having comparatively low LUMO (Lowest Unoccupied Molecular Orbital) level. Examples of material of the hole transport layer include polymer containing aromatic amine such as polyarylene derivative containing aromatic amine on the side chain or the main chain, e.g., polyvinyl carbazole (PVCz), polypyridine, polyaniline and the like. However, the material of the hole transport layer is not limited thereto.

Note that, examples of material of the hole transport layer include 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4''-tris(N-(3-methylphenyl)N-phenylamino)triphenylamine (MTDATA), 4,4'-N,N'-dicarbazolebiphenyl (CBP), Spiro-NPD, spiro-TPD, spiro-TAD, TNB and the like.

Examples of material of the hole injection layer include organic material containing thiophene, triphenylmethane, hydrazoline, amylamine, hydrazone, stilbene, triphenylamine and the like. In detail, examples of materials of the hole injection layer include aromatic amine derivative such as polyvinyl carbazole, polyethylenedioxythiophene:polystyrenesulfonate (PEDOT:PSS), TPD and the like. These materials can be used alone or in combination of two or more.

The hole injection layer mentioned above can be formed into a film shape with a wet process such as a coating method (e.g., a spin coating method, spray coating method, dye coating method, and gravure printing method).

It is preferable that the interlayer 33 has a carrier blocking function (in this configuration, an electron blocking function) of serving as a first carrier barrier (in this configuration, an electron barrier) which suppresses leakage of the first carrier (in this configuration, an electron) from the light-emitting layer 32 to the second electrode 40. Further, it is preferable that the interlayer 33 has a function of transporting the second carrier (in this configuration, a hole) to the light-emitting layer 32, and a function of preventing quenching of an excited state of the light-emitting layer 32. Note that, in the present embodiment, the interlayer 33 serves as an electron blocking layer which suppresses leakage of an electron from the light-emitting layer 32.

In the organic electroluminescence element, with providing the interlayer 33, it is possible to improve the luminous efficiency and prolong the lifetime.

Examples of material of the interlayer 33 include polyarylamine and derivative thereof, polyfluorene and derivative thereof, polyvinyl carbazole and derivative thereof, and triphenyldiamine derivative.

The interlayer 33 as mentioned above can be formed into a film shape with a wet process such as a coating method (e.g., a spin coating method, spray coating method, dye coating method, and gravure printing method).

Examples of material of the insulating layer 35 include polyimide, novolak resin, and epoxy resin. The insulating layer 35 can be formed into a film shape with a wet process like a coating method (e.g., a spin coating method, spray coating method, dye coating method, and gravure printing method).

The cathode is an electrode for injecting an electron (first carrier) treated as a first charge into the functional layer 30. In the case where the first electrode 20 serves as a cathode, the cathode is preferably made of an electrode material such as metal, alloy, or electrically conductive compound that has a small work function, and a mixture thereof. Further, it is preferable that the cathode is made of material having a work function of 1.9 eV or more to 5 eV or less in order to limit a difference between an energy level of the cathode and a LUMO (Lowest Unoccupied Molecular Orbital) level within an appropriate range.

Examples of electrode material of the cathode include aluminum, silver, magnesium, gold, copper, chrome, molybdenum, palladium, tin, and alloy of these and other metal such as magnesium-silver mixture, magnesium-indium mixture, aluminum-lithium alloy and the like. The cathode may be formed of laminated film including a thin film made of aluminum and an ultrathin film (a thin film having a thickness of 1 nm or less so as to allow an electron to flow with tunneling injection) made of aluminum oxide, for example. Such an ultrathin film may be made of metal, metal oxide, or mixture of these and other metal.

In a case where the cathode is designed as a reflecting electrode, it is preferable that the cathode be made of metal having high reflectance with respect to the light emitted from the light-emitting layer 32 and having a low resistivity, such as aluminum and silver.

Note that, in a case where the first electrode 20 is the anode that serves as the electrode for injecting a hole (second carrier) treated as the second charge into the functional layer 30, the first electrode 20 is preferably made of metal having a large work function. Further it is preferable that the anode is made of material having a work function of 4 eV or more to 6 eV or less in order to limit a difference between an energy level of the first electrode 20 and a HOMO (Highest Occupied Molecular Orbital) level within an appropriate range.

The second electrode 40 is an electrode made of material including metal powder and an organic binder. In other words, the second electrode (the second electrode layer) 40 is made of a mixture of metal powder and an organic binder. Examples of such kind of metal include silver, gold, and copper.

Thus, in the organic electroluminescence element, since the second electrode 40 can have a resistivity and a sheet resistance that are lower than those of the second electrode 40 provided as a thin film made of the electrically conductive transparent oxide, the second electrode 40 can have a decreased resistance, and therefore the luminance unevenness can be reduced. Note that, the electrically conductive material used for the second electrode 40 may be alloy, carbon black or the like, as substitute for metal.

For example, the second electrode 40 can be formed by printing, with a screen printing method or a gravure printing method, paste (printing ink) prepared by mixing metal powder with a set of an organic binder and an organic solvent.

Examples of materials of the organic binder include acrylic resin, polyethylene, polypropylene, polyethylene terephthalate, polymethylmethacrylate, polystyrene, polyether sulfone, polyarylate, polycarbonate resin, polyurethane, polyacrylonitrile, polyvinyl acetal, polyamide, polyimide, diacryl phthalate resin, cellulosic resin, polyvinyl chloride, polyvinylidene chloride, polyvinyl acetate, other thermoplastic resin, and copolymer containing at least different two of monomers constituting the above-listed resin. Note that, the material of the organic binder is not limited thereto.

Note that in the organic electroluminescence element of the present embodiment, the thickness of the first electrode 20 is selected to be within a range of 80 nm to 200 nm, and the thickness of the first carrier injection layer is selected to be within a range of 5 nm to 50 nm, and the thickness of the light-emitting layer 32 is selected to be within a range of 60 nm to 100 nm, and the thickness of the interlayer 33 is selected to be 15 nm, and the thickness of the second carrier injection layer 34 is selected to be within a range of 10 nm to 100 nm, and the thickness of the insulating layer 35 is selected to be 80 nm. However, the aforementioned values are only examples and the thicknesses thereof are not limited particularly.

The second electrode 40 is formed into a grid shape (a net-like shape) as shown in FIGS. 1 and 2 and includes a plurality (thirty-six in the instance shown in FIG. 2) of first opening parts 41. In this regard, in the second electrode 40 shown in FIG. 2, each first opening part 41 has a square shape. In brief, the second electrode 40 shown in FIG. 2 is formed into a square grid shape.

In the second electrode 40 shown in FIG. 2, the patterned wire 40a includes a plurality of narrow line part 44 (44a) extending in a first direction (left and right direction in FIG. 2), and a plurality of narrow line parts 44 (44b) extending in a second direction (upward and downward direction in FIG. 2) perpendicular to the first direction. The plurality of (seven, in the illustrated instance) narrow line parts 44a are arranged at regular intervals in the second direction. The plurality of (seven, in the illustrated instance) narrow line parts 44b are arranged at regular intervals in the first direction. The plurality of narrow line parts 44a and the plurality of narrow line parts 44b are perpendicular to each other. In the second electrode 40 shown in FIG. 2, a space enclosed by the adjacent narrow line parts 44a and 44a and the adjacent narrow line parts 44b and 44b defines the first opening part 41.

With regard to the dimensions of the patterned electrode 40a that has a square grid shape and constitutes the second electrode 40, for example, a line width L1 (see FIG. 3) is in a range of 1 μm to 100 μm, and a height H1 (see FIG. 3) is in a range of 50 nm to 100 μm, and a pitch P1 (see FIG. 3) is in a range of 100 μm to 2000 μm.

However, respective value ranges of the line width L1, the height H1 and the pitch P1 of the electrode pattern 40a of the second electrode 40 are not definite particularly, but may be selected appropriately based on the size in the plan view of the element part 1.

In this regard, to improve the use efficiency of the light produced in the light-emitting layer 3, it is preferable that the line width L1 of the patterned electrode 40a of the second electrode 40 is decreased. In contrast, to suppress the luminance unevenness by decreasing the resistance of the second electrode 40, it is preferable that the line width L1 of the patterned electrode 40a of the second electrode 40 is increased. Hence, it is preferable that the line width L1 is appropriately selected depending on the planar size of the organic electroluminescence element, for example.

Further, it is preferable that the height H1 of the second electrode 40 is within a range of 100 nm to 10 μm. This range may be selected in view of: decreasing the resistance of the second electrode 40; improving the efficient use of the material (material use efficiency) of the second electrode 40 in a process of forming the second electrode 40 with a coating method such as a screen printing method; and selecting an appropriate radiation angle of the light emitted from the functional layer 30.

Furthermore, in the organic electroluminescence element of the present embodiment, as shown in FIGS. 1 and 3, each first opening part 41 in the second electrode 40 is formed into such an opening shape that an opening area is gradually increased with an increase in a distance from the functional layer 30.

Thus, in the organic electroluminescence element, a spread angle of the light emitted from the functional layer 30 can be increased and therefore the luminance unevenness can be more reduced. Furthermore, in the organic electroluminescence element, it is possible to reduce a reflection loss and an absorption loss at the second electrode 40. Therefore, the external quantum efficiency of the organic electroluminescence element can be more improved.

In a case where the second electrode 40 is formed into a grid shape, the shape of each first opening part 41 is not limited to a square shape, but may be a rectangular shape, an equilateral triangle shape, or a regular hexagonal shape, for example.

In a case where the shape of each first opening part 41 is an equilateral triangle shape, the second electrode 40 is formed into a triangle grid shape. In a case where the shape of each first opening part 41 is a regular hexagonal shape, the second electrode 40 is formed into a hexagonal grid shape.

Note that the shape of the second electrode 40 is not limited to a grid shape, but may be a comb shape, for example. The second electrode 40 may also be constituted by a set of two patterned electrodes each formed into a comb shape. In brief, the organic electroluminescence element may include a plurality of second electrodes 40.

Further, the number of first opening parts 41 of the second electrode 40 is not particularly limited, but may be one or more. For example, in the case where the second electrode 40 has a comb shape or the second electrode 40 is constituted by the two patterned electrodes each having a comb shape, the number of first opening part 41 can be one.

Figure 4:
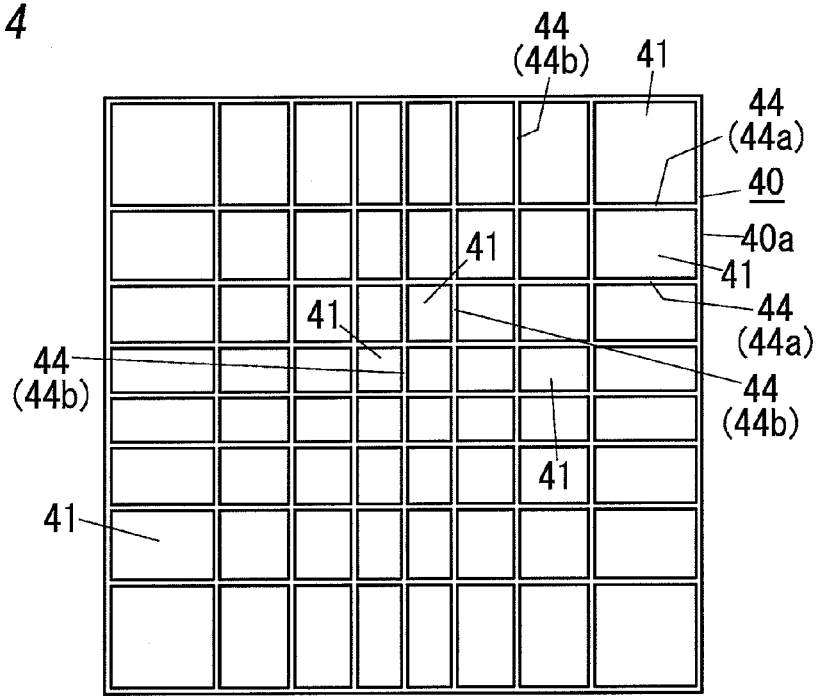
FIG. 4 is a schematic plan view illustrating another configuration example of the second electrode of the organic electroluminescence element of the first embodiment.

Further, the second electrode 40 may be formed to have a planar shape shown in FIG. 4. That is, the second electrode 40 may be formed into such a shape in a plan view that the straight narrow line parts 44 of the patterned electrode 40a have the same line width and the opening area of the first opening part 41 is decreased by decreasing the interval between the adjacent narrow line parts 44 with an increase in a distance from the periphery of the second electrode 40.

In the second electrode 40 shown in FIG. 4, a plurality (nine, in the illustrated instance) of narrow line parts 44a are arranged in a second direction (upward and downward direction in FIG. 4) such that an interval between the narrow line parts 44a becomes shorter towards the center than at the edge of the patterned wire 40a. A plurality (nine, in the illustrated instance) of narrow line parts 44b are arranged in a first direction (left and right direction in FIG. 4) such that an interval between the narrow line parts 44b becomes shorter towards the center than at the edge of the patterned wire 40a.

In the organic electroluminescence element, the second electrode 40 is formed into the planar shape shown in FIG. 4 and, therefore, in contrast to the case where the second electrode 40 is formed into the planar shape shown in FIG. 2, it is possible to improve the luminous efficiency of the second electrode 40 at the center which is farther from the second terminal part 47 (see FIG. 1) than the periphery is. Consequently, the external quantum efficiency of the organic electroluminescence element can be improved.

Further, in the organic electroluminescence element, since the second electrode 40 is formed into the planar shape shown in FIG. 4, in contrast to a case where the second electrode 40 is formed into the planer shape shown in FIG. 2, it is possible to suppress current crowding at a periphery of the functional layer 30 which is close to the first terminal part and the second terminal part 47. Consequently, the lifetime of the organic electroluminescence element can be extended.

Figure 5:
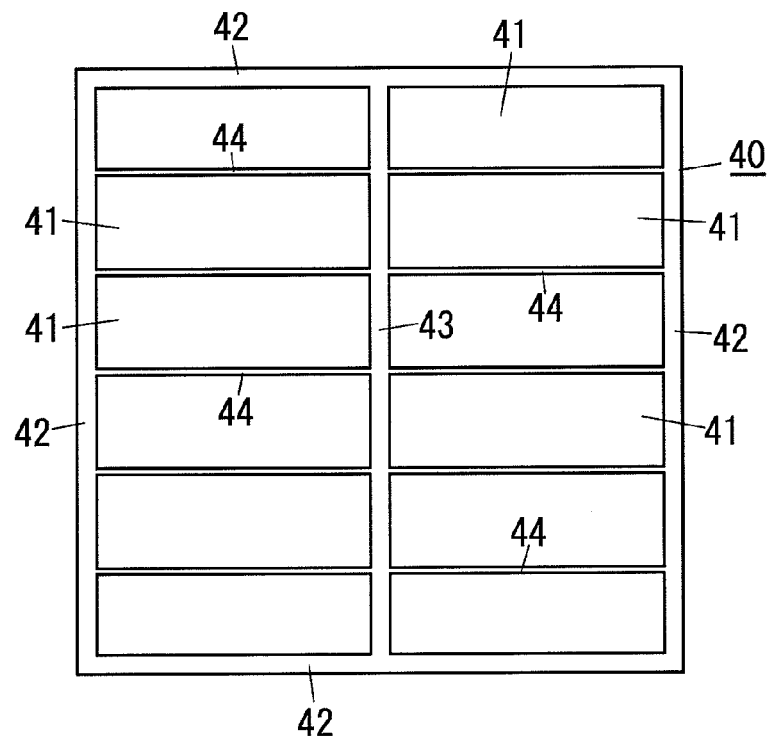
FIG. 5 is a schematic plan view illustrating another configuration example of the second electrode of the organic electroluminescence element of the first embodiment.

Further, the second electrode 40 may be formed to have a planar shape shown in FIG. 5. In other words, the second electrode 40 is formed such that in a plan view widths of four first narrow line parts 42 defining the periphery of the second electrode 40 and a width of a single second narrow line part 43 located at the center in a left and right direction of FIG. 5 are greater than a width of a narrow line part (third narrow line part) 44 located between the first narrow line part 42 and the second narrow line part 43.

In the organic electroluminescence element, since the second electrode 40 is formed into the planar shape shown in FIG. 5, in contrast to a case where the second electrode 40 is formed into the planar shape shown in FIG. 2, it is possible to improve the luminous efficiency of the second electrode 40 at the center which is farther from the second terminal part 47 (see FIG. 1) than the periphery is. Consequently, the external quantum efficiency of the organic electroluminescence element can be improved.

Note that, in the case where the second electrode 40 is formed into the planar shape shown in FIG. 5, with increasing the heights of the first narrow line part 42 and the second narrow line part 43 that have the relatively large widths to be greater than the height of the third narrow line part 44, it is possible to more decrease the resistances of the first narrow line part 42 and the second narrow line part 43.

The electrically conductive layer 50 is present between the second electrode 40 and the insulating layer 35 and inside the second opening parts 37 while being in contact with the second electrode 40 and the functional layer 30. In other words, as shown in FIG. 3, the electrically conductive layer 50 includes: a first portion 50a covering the region (exposed region) 32c of the second surface 32b exposed through the opening part (first opening part) 41; and a second portion 50b interposed between the insulating layer 35 and the electrode part 40a.

Further, the electrically conductive layer 50 is preferably made of either a transparent conductive film including a conductive nanostructure and a transparent medium; or a metal thin film having such a thickness that the light emitted from the functional layer 30 is allowed to pass through the metal thin film. In other words, the electrically conductive layer 50 is a transparent conductive film made of a transparent medium containing a conductive nanostructure, or a metal thin film having a thickness to enable light (light emitted from the light-emitting layer 32) to pass therethrough.

The electrically conductive layer 50 serves as an injection pathway for transferring the second carrier from the second electrode 40 to the functional layer 30. In a case where the second electrode 40 serves as an anode, the second carriers are holes. In a case where the second electrode 40 serves as a cathode, the second carriers are electrons.

In a case where the organic electroluminescence element is devoid of the electrically conductive layer 50 and the insulating layer 35, and part of the functional layer 30 is directly beneath the second electrode 40, and the first opening part 41 is filled with part of the encapsulating member 90 with an electrically insulation property instead of the electrically conductive layer 50, the second carriers are probably injected from the second electrode 40 into the functional layer 30 through only an interface between the second electrode 40 and the functional layer 30.

In contrast, in a case where the insulating layer 35 and the electrically conductive layer 50 are provided, the second carriers are injected from the second electrode 40 into the functional layer 30 through an interface between the second electrode 40 and the electrically conductive layer 50 and an interface between the electrically conductive layer 50 and the functional layer 30.

In this regard, in the organic electroluminescence element of the present embodiment, since the functional layer 30 includes the insulating layer 35 in the projection region of the second electrode 40 in the thickness direction, the second carrier is injected from the second electrode 40 into the functional layer 30 mostly through a pathway passing through the two interfaces of the interface between the second electrode 40 and the electrically conductive layer 50 and the interface between the electrically conductive layer 50 and an outermost layer (the second carrier injection layer 34, in the instance shown in FIG. 1) of the functional layer 30 with the exception of the insulating layer 35.

In this regard, the electrical conductivity of the whole in a lateral direction of the second electrode is improved with a decrease in the resistivity of the electrically conductive layer 50. Hence, it is possible to suppress the in-plane variation in the current flowing through the light-emitting layer 32, and therefore the luminance unevenness can be reduced.

Examples of the electrically conductive nanostructure include conductive nano-particle, conductive nano-wire and the like. The conductive nano-particle preferably has a particle size of 1 nm to 100 nm. The conductive nano-wire preferably has a diameter of 1 nm to 100 nm.

Examples of material of the electrically conductive nanostructure include silver, gold, ITO, IZO and the like.

Examples of the transparent medium as binder include acrylic resin, polyethylene, polypropylene, polyethylene terephthalate, polymethylmethacrylate, polystyrene, polyether sulfone, polyarylate, polycarbonate resin, polyurethane, polyacrylonitrile, polyvinyl acetal, polyamide, polyimide, diacryl phthalate resin, cellulosic resin, polyvinyl chloride, polyvinylidene chloride, polyvinyl acetate, other thermoplastic resin, and copolymer containing at least two of the above-listed resin components. Note that, the material of the transparent medium is not limited thereto.

It is preferable that conductive polymer is used for the binder. Examples of the conductive polymer include polythiophene, polyaniline, polypyrrole, polyphenylene, polyphenylenevinylene, polyacetylene, polycarbazole and the like. These materials can be used alone or in combination.

When the conductive polymer is used for the binder, the electrically conductive layer 50 has a further improved conductivity. For the purpose of improving the conductivity, the binder may be doped with a dopant such as sulfonate acid, Lewis acid, proton acid, alkali metal, alkali earth metal and the like.

In the case where the electrically conductive layer 50 is formed of the metal thin film as described above, the metal thin film may be made of silver, gold, or the like. The thickness of the metal thin film is equal to or less than 30 nm, is preferably equal to or less than 20 nm, and is further preferably equal to or less than 10 nm, from the viewpoint of the light transmissive properties. Note that, if the thickness of the electrically conductive layer 50 becomes too thin, the injection property of the second carrier to the functional layer 30 through the injection pathway which passes from the second electrode 40 through the conductive layer 50 may be insufficient.

As described above, in the organic electroluminescence element of the present embodiment, each resistivity of the first electrode 20 and the second electrode 40 is less than the resistivity of the transparent conducting oxide. The second electrode 40 is provided with the first opening part 41 for allowing light from the functional layer 30 to pass. Further, in the organic electroluminescence element of the present embodiment, the functional layer 30 includes the insulating layer 35 which is on the side of the light-emitting layer 32 close to the second electrode 40 to be in the projection region of the second electrode in the thickness direction and includes the second opening part 37 for allowing light from the functional layer 30 to pass. The electrically conductive layer 50 has a light transmissive property, and is located between the second electrode 40 and the insulating layer 35 and in the second opening part 37 while being in contact with the second electrode 40 and the functional layer 30.

In other words, the organic electroluminescence element of the present embodiment includes: the light-emitting layer 32; the first electrode layer (first electrode) 20 disposed on the first surface 32a in the thickness direction (upward and downward direction in FIG. 1) of the light-emitting layer 32; the second electrode layer (second electrode) 40 disposed on the second surface 32b in the thickness direction of the light-emitting layer 32; the electrically conductive layer 50; and the insulating layer 35. The light-emitting layer 32 is configured to emit light when a predetermined voltage is applied between the first electrode layer 20 and the second electrode layer 40. The second electrode layer 40 includes the electrode part (patterned electrode) 40a covering the second surface 32b and the opening part (first opening part) 41 formed in the electrode part 40a to expose the second surface 32b. The electrically conductive layer 50 is configured to allow the light (light emitted from the light-emitting layer 32) to pass therethrough, and is interposed between the second surface 32b and the second electrode layer 40 to cover the second surface 32b. The insulating layer 35 is interposed between the second surface 32b and the electrically conductive layer 50 to overlap the electrode part (patterned electrode) 40a in the thickness direction (thickness direction of the light-emitting layer 32).

In particular, in the organic electroluminescence element of the present embodiment, each resistivity of the first electrode layer 20 and the second electrode layer 40 is less than the resistivity of the transparent conductive oxide. Note that examples of the transparent conductive oxide include ITO, AZO, GZO, IZO and the like.

Therefore, according to the organic electroluminescence element of the present embodiment, the luminance unevenness can be reduced and the external quantum efficiency can be improved.

Further, in this organic electroluminescence element, it is preferred that a height (first height) from the light-emitting layer 32 to the top surface of the electrically conductive layer 50 at the second opening part 37 is smaller than a height (second height) from the light-emitting layer 32 to the top of the second electrode 40.

In other words, in the organic electroluminescence element of the present embodiment, the electrically conductive layer 50 includes the first part 50a designed to cover the region 32c of the second surface 32b exposed via the opening part (first opening part) 41 and the second part 50b interposed between the insulating layer 35 and the electrode part 40a. The first part 50a has the thickness less than the total of the thicknesses of the insulating layer 35, the second part 50b, and the electrode part 40a.

In the example shown in FIG. 3, the first height is defined as the sum of the thickness of the interlayer 33, the thickness of the second carrier injection layer 34, and the thickness of the portion of the electrically conductive layer 50 that is directly located on the second carrier injection layer 34. Further, the second height is defined as the sum of the thickness of the interlayer 33, the thickness of the second carrier injection layer 34, the thickness of the insulating layer 35, the thickness of the portion of the electrically conductive layer 50 that is directly located on the insulating layer 35, and the height H1 of the second electrode 40.

In the organic electroluminescence element, the first height is smaller than the second height and, therefore, the loss of light in the electrically conductive layer 50 can be reduced and the external quantum efficiency can be improved. Note that, the thickness of the electrically conductive layer 50 may be greater than the thickness of the insulating layer 35.

In this organic electroluminescence element, it is preferable that the second electrode 40 serves as an anode and that the functional layer 30 includes the hole injection layer serving as the second carrier injection layer 34 on the side of the light-emitting layer 32 close to the second electrode 40.

In other words, the organic electroluminescence element of the present embodiment further includes the hole injection layer (second hole injection layer in the present embodiment) 34. The first electrode layer 20 serves as a cathode. The second electrode layer 40 serves as an anode. The hole injection layer 34 is interposed between the light-emitting layer 32 and the electrically conductive layer 50. The insulating layer 35 is present between the hole injection layer 34 and the electrically conductive layer 50. Note that the hold injection layer is designed to promote transfer of the hole from the electrically conductive layer 50 to the light-emitting layer 32.

Thus, in the organic electroluminescence element, it is possible to efficiently inject the hole of the second carrier into the light-emitting layer 32 and consequently improve the external quantum efficiency.

Note that, in the organic electroluminescence element of the present embodiment, the electron blocking layer (interlayer in the present embodiment) 33 is interposed between the light-emitting layer 32 and the hole injection layer 34 to prevent a leakage of the electrons from the light-emitting layer 32 to the hole injection layer 34.

(Second Embodiment)

Figure 6:
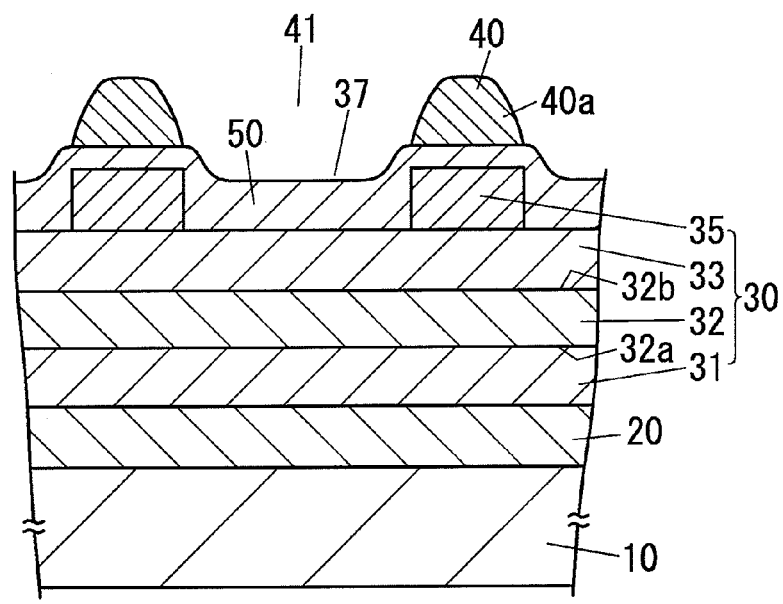
FIG. 6 is a schematic sectional view illustrating the primary part of the organic electroluminescence element of the second embodiment.
Figure 7:
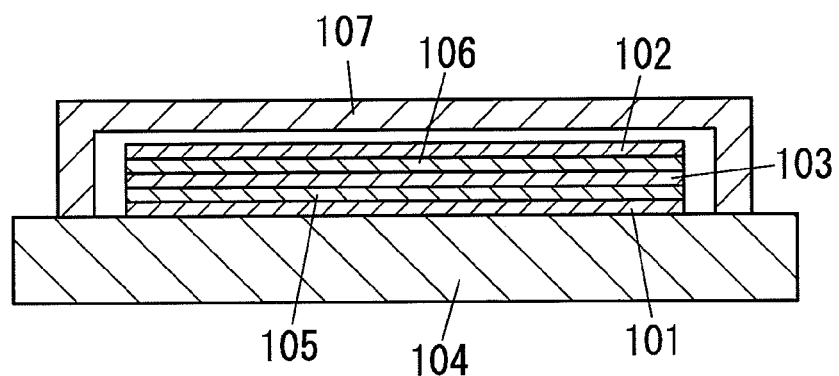
FIG. 7 is a schematic sectional view illustrating the organic electroluminescence element of the prior art.
Figure 8:
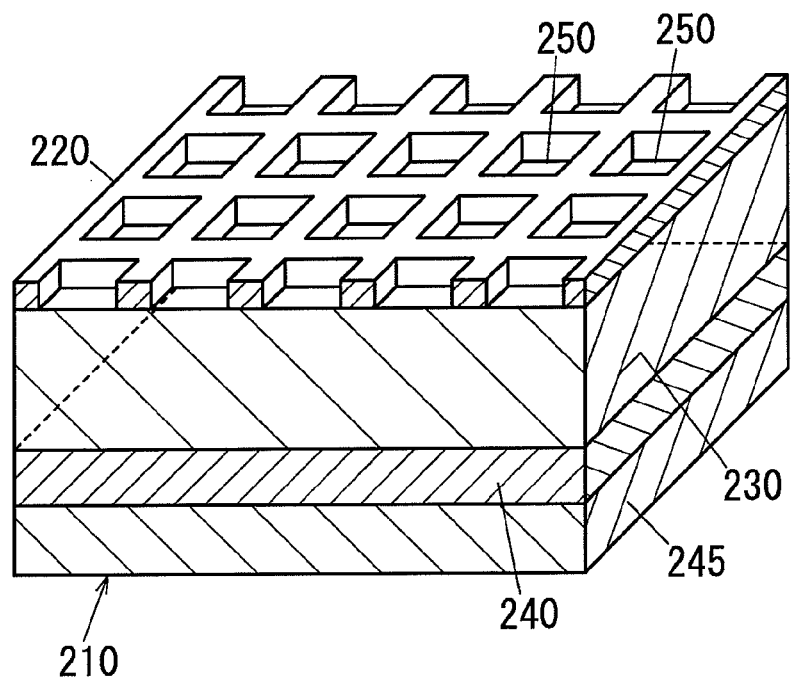
FIG. 8 is a top perspective sectional view illustrating the electroluminescence lamp of the prior art.

The organic electroluminescence element of the present embodiment is substantially same as the first embodiment but as shown in FIG. 6 is different from the first embodiment in that the electrically conductive layer 50 has a hole injection function and that the insulating layer 35 and the interlayer 33 of the functional layer 30 are in contact with the electrically conductive layer 50, for example.

Further, in the organic electroluminescence element of the present embodiment, the electrically conductive layer 50 has the hole injection function and therefore the second carrier injection layer 34 serving as the hole injection layer described in the first embodiment is not omitted. Note that, components of the present embodiment same as those of the first embodiment are designated by the same reference numerals and explanations thereof are deemed unnecessary.

The electrically conductive layer 50 having the hole injection function can be formed by use of, for example, an electrically conductive nanostructure and a conductive polymer described in the first embodiment. Further, the electrically conductive layer 50 having the hole injection function can be formed of a composite film made of a mixture of the material of the hole injection layer described in the first embodiment and an electrically conductive nanostructure.

In the organic electroluminescence element of the present embodiment, the second electrode 40 serves as an anode, and the electrically conductive layer 50 has the hole injection function, and the functional layer 30 includes the interlayer 33 serving as the electron blocking layer which is located on the side of the light emitting layer 32 close to the second electrode 40 to suppress a leakage of electrons from the light emitting layer 32 while the insulating layer 35 and the interlayer 33 are in contact with the electrically conductive layer 50.

In other words, the organic electroluminescence element of the present embodiment further includes the electron blocking layer (interlayer in the present embodiment) 33. The first electrode layer 20 serves as a cathode. The second electrode layer 40 serves as an anode. The electrically conductive layer 50 is designed to function as a hole injection layer. The electron blocking layer 33 is interposed between the light-emitting layer 32 and the electrically conductive layer 50. The insulating layer 35 is present between the electron blocking layer (interlayer) 33 and the electrically conductive layer 50. Note that the electron blocking layer 33 is designed to prevent electrons from passing therethrough. Consequently, the electron blocking layer 33 suppresses a leakage of electrons from the light-emitting layer 32 to the electrically conductive layer 50.

Therefore, the organic electroluminescence element of the present embodiment can reduce the luminance unevenness.

The organic electroluminescence elements described in the first and second embodiments are preferably available, for example, for organic electroluminescence elements for lighting use. However, the organic electroluminescence elements are available for not only lighting use but also other use.

Note that, the figures used for describing the first and second embodiments are schematic ones, and do not necessarily show the actual ratio of the length, thickness, or the like of the components.

The invention claimed is:

1. An organic electroluminescence element comprising:
a light-emitting layer;
a first electrode layer disposed on a first surface in a thickness direction of the light-emitting layer;
a second electrode layer disposed on a second surface in the thickness direction of the light-emitting layer;
an electrically conductive layer; and
an insulating layer,
wherein:
the light-emitting layer is configured to emit light when a predetermined voltage is applied between the first electrode layer and the second electrode layer;
the second electrode layer includes an electrode part covering the second surface and an opening part formed in the electrode part to expose the second surface;
the electrically conductive layer is configured to allow the light to pass therethrough, and is interposed between the second surface and the second electrode layer to cover the second surface; and
the insulating layer is interposed between the second surface and the electrically conductive layer to overlap the electrode part in the thickness direction.

2. The organic electroluminescence element as set forth in claim 1, wherein:
the electrically conductive layer includes a first part designed to cover a region of the second surface exposed via the opening part and a second part interposed between the insulating layer and the electrode part; and
the first part has a thickness less than a total of thicknesses of the insulating layer, the second part, and the electrode part.

3. The organic electroluminescence element as set forth in claim 1, further comprising a hole injection layer,
wherein:
the first electrode layer serves as a cathode;
the second electrode layer serves as an anode;
the hole injection layer is interposed between the light-emitting layer and a set of the electrically conductive layer and the electrode part; and
the insulating layer is present between the hole injection layer and the electrically conductive layer.

4. The organic electroluminescence element as set forth in claim 1, further comprising an electron blocking layer,
wherein:
the first electrode layer serves as a cathode;
the second electrode layer serves as an anode;
the electrically conductive layer is designed to function as a hole injection layer;
the electron blocking layer is interposed between the light-emitting layer and a set of the electrically conductive layer and the electrode part; and
the insulating layer is present between the electron blocking layer and the electrically conductive layer.

5. The organic electroluminescence element as set forth in claim 1, wherein
the second electrode layer is made of a mixture of metal powder and an organic binder.

6. The organic electroluminescence element as set forth in claim 1, wherein
the electrically conductive layer is: a transparent conductive film made of a transparent medium containing an electrically conductive nanostructure; or a metal thin film having a thickness to allow the light to pass therethrough.

7. The organic electroluminescence element as set forth in claim 1, wherein
each material of the first electrode layer and the second electrode layer has a resistivity lower than a resistivity of a transparent conducting oxide.

* * * * *